United States Patent
Tanaka

(10) Patent No.: US 9,935,249 B2
(45) Date of Patent: Apr. 3, 2018

(54) LIGHT EMITTING DEVICE AND METHOD FOR MANUFACTURING THE SAME

(71) Applicant: STANLEY ELECTRIC CO., LTD., Meguro-ku, Tokyo (JP)

(72) Inventor: Satoshi Tanaka, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/157,052

(22) Filed: May 17, 2016

(65) Prior Publication Data

US 2016/0351620 A1    Dec. 1, 2016

(30) Foreign Application Priority Data

May 25, 2015  (JP) .................................. 2015-105097

(51) Int. Cl.
| | |
|---|---|
| *H01L 33/58* | (2010.01) |
| *H01L 25/075* | (2006.01) |
| *H01L 33/50* | (2010.01) |
| *H01L 33/60* | (2010.01) |
| *H01L 33/46* | (2010.01) |

(52) U.S. Cl.
CPC .......... *H01L 33/58* (2013.01); *H01L 25/0753* (2013.01); *H01L 33/50* (2013.01); *H01L 33/46* (2013.01); *H01L 33/60* (2013.01); *H01L 2933/0025* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | | | |
|---|---|---|---|---|
| 2009/0101930 A1* | 4/2009 | Li | ........................... | G02B 6/005 257/98 |
| 2009/0114929 A1* | 5/2009 | Lee | ..................... | H01L 25/0753 257/88 |
| 2013/0299816 A1* | 11/2013 | Bessho | .................. | H01L 27/322 257/40 |
| 2015/0262978 A1* | 9/2015 | Shibata | ................ | F21S 48/1154 257/89 |

FOREIGN PATENT DOCUMENTS

| | | |
|---|---|---|
| JP | 3941487 B2 | 7/2007 |
| JP | 2010087224 A | 4/2010 |
| JP | 2014197690 A | 10/2014 |
| JP | 2014220295 A | 11/2014 |

* cited by examiner

*Primary Examiner* — Hoang-Quan Ho
(74) *Attorney, Agent, or Firm* — Holtz, Holtz & Volek PC

(57) ABSTRACT

Provided is a light emitting device that includes a plurality of light-emitting elements, a fluorescent layer that is disposed on or above the plurality of light-emitting elements, and light blocking layers that are disposed in the fluorescent layer, two of the light blocking layers being disposed, when an adjacent two of the plurality of light-emitting elements are seen, at positions each of which is closer than the center of a region between the two light-emitting elements to the center of one of the two light-emitting elements while the center of the region between the two light-emitting elements functions as a reference.

18 Claims, 15 Drawing Sheets

PRIOR ART

LIGHT EMITTING DEVICE AND METHOD FOR MANUFACTURING THE SAME

CROSS-REFERENCE TO RELATED APPLICATION

This application is based upon and claims the benefit of priority of the prior Japanese Patent Application No. JP 2015-105097, filed on May 25, 2015, the entire contents of which are incorporated herein by reference.

BACKGROUND OF THE INVENTION

A) Field of the Invention

The present invention relates to a light emitting device and a method for manufacturing the light emitting device.

B) Description of the Related Art

FIG. 12 is a schematic sectional view illustrating a semiconductor light emitting device of the related art. A light emitting device is used as, for example, a light source of a vehicle illumination device such as a vehicle headlight. In the light emitting device illustrated in FIG. 12, a plurality of light emitting diode (LED) elements 54 are mounted on a substrate 51 made of, for example, silicon (Si).

Each of the LED elements 54 includes a support substrate 54b and a semiconductor layer 54a that is disposed on the support substrate 54b. The semiconductor layer 54a includes, for example, an n-type semiconductor layer, an active layer (light emitting layer), and a p-type semiconductor layer. An n-side electrode is electrically connected to the n-type semiconductor layer, and a p-side electrode is electrically connected to the p-type semiconductor layer. An example of each of the LED elements 54 is a nitride-based semiconductor light-emitting element that emits blue light.

The LED elements 54 are bonded to corresponding metal patterns 52, which are disposed on the Si substrate 51, with corresponding bonding layers 53 interposed therebetween. The LED elements 54 can be driven independently of one another, that is, independent control of the LED elements 54 in a light-emitting state and in a non-light-emitting state can be performed by a driving signal (power) supplied by a driving circuit via the metal patterns 52.

A fluorescent layer 55 is disposed on the LED elements 54. The fluorescent layer 55 includes, for example, fluorescent particles that emit yellow light. The blue light that is emitted by the LED elements 54 and that is incident on the fluorescent particles of the fluorescent layer 55 is converted into yellow light by wavelength conversion. The yellow light obtained by the wavelength conversion and the blue light that was not incident on the fluorescent particles are emitted from the fluorescent layer 55 and visually recognized as white light.

In the light emitting device illustrated in FIG. 12, regions between the LED elements 54 are non-light-emitting regions, and thus, when two of the LED elements 54 that are adjacent to each other are turned on, a dark portion is formed in the region (non-light-emitting region) between the two LED elements 54. For example, in the case where the plurality of LED elements 54 are arranged in a matrix and where all the LED elements 54 are turned on, a dark portion is formed in lines or in a grid-like pattern, and accordingly, a problem occurs in that a uniform illumination pattern cannot be formed in a vehicle headlight.

In addition, for example, in the case where two of the LED elements 54 are adjacent to each other, one of the two LED elements 54 being turned on, and the other one of the two LED elements 54 being turned off, light emitted from the one of the two LED elements 54, which is turned on, is propagated to a region in which light is not turned on through the fluorescent layer 55, which in turn results in cross talk. Cross talk is a phenomenon in which light appears to be emitted at a position at which no LED element is disposed or at a position at which an LED element that is turned off is disposed. A problem occurs in that this cross talk makes it difficult to obtain a good contrast.

There is known a technology for arranging a light blocking object between LED elements in order to suppress the occurrence of cross talk (see, for example, Japanese Unexamined Patent Application Publication No. 2010-87224 and Japanese Patent No. 3941487). However, in order to arrange such a light blocking object, it is necessary to increase the gap between LED elements. As a result, the luminance between the LED elements is reduced, and consequently, a notable dark portion will be formed between the LED elements that are turned on.

As described above, it is difficult to realize both a reduction in the area of a dark portion and a reduction in the probability of the occurrence of cross talk.

A light emitting device that includes a light blocking portion in a fluorescent layer has been disclosed (see, for example, Japanese Unexamined Patent Application Publication Nos. 2014-197690 and 2014-220295).

In the invention described in Japanese Unexamined Patent Application Publication No. 2014-197690, a plurality of light blocking portions and portions of a fluorescent layer are integrally formed and mounted on an array of LED elements, or a plurality of members that are combinations of portions of a fluorescent layer and light blocking portions are formed and mounted on an array of LED elements.

The fluorescent layer described in Japanese Unexamined Patent Application Publication No. 2014-220295 includes, for example, fluorescent portions of the three primary colors, which are red, green, and blue (RGB) and whitish partition portions that are disposed between the fluorescent portions, and color rendering effect can be obtained.

SUMMARY OF THE INVENTION

Accordingly, it is an object of the present invention to provide a light emitting device capable of suppressing the occurrence of cross talk and a method for manufacturing the light emitting device.

In addition, it is another object of the present invention to provide a light emitting device capable of reducing the area of a dark portion and a method for manufacturing the light emitting device.

A light emitting device according to an aspect of the present invention includes a plurality of light-emitting elements, a fluorescent layer that is disposed on or above the plurality of light-emitting elements, and light blocking layers that are disposed in the fluorescent layer, two of the light blocking layers being disposed, when an adjacent two of the plurality of light-emitting elements are seen, at positions each of which is closer than the center of a region between the two light-emitting elements to the center of one of the two light-emitting elements while the center of the region between the two light-emitting elements functions as a reference.

A method for manufacturing a light emitting device according to another aspect of the present invention includes preparing a support substrate that includes a protruding portion, disposing a first fluorescent layer on a top surface and a side surface of the protruding portion and disposing a light blocking layer on the first fluorescent layer, forming a second fluorescent layer on the support substrate including a region in which the protruding portion is formed, grinding the second fluorescent layer to a thickness at which at least the light blocking layer is removed, and disposing the support substrate on or above a plurality of light-emitting elements.

According to the present invention, a light emitting device capable of suppressing the occurrence of cross talk and a method for manufacturing the light emitting device can be provided.

In addition, a light emitting device capable of reducing the area of a dark portion and a method for manufacturing the light emitting device can be provided.

DESCRIPTION OF EMBODIMENTS

Figure 1A:
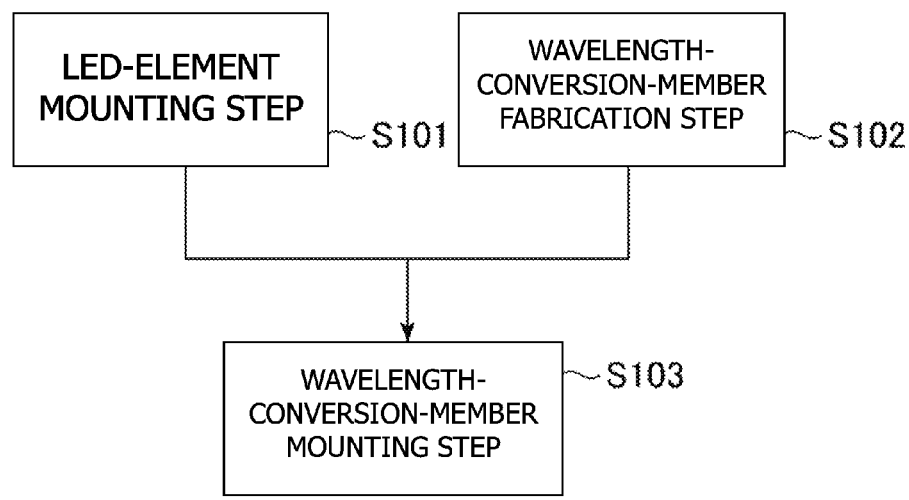
FIG. 1A is a schematic flowchart illustrating a method for manufacturing a light emitting device according to a first embodiment of the present invention.

FIG. 1A is a schematic flowchart illustrating a method for manufacturing light emitting devices according to embodiments of the present invention.

The light emitting devices according to the embodiments are manufactured through LED-element mounting step S101, wavelength-conversion-member fabrication step S102, and wavelength-conversion-member mounting step S103. LED elements are disposed on a substrate in LED-element mounting step S101. A wavelength-conversion member that has, for example, a fluorescent region is fabricated in wavelength-conversion-member fabrication step S102. In wavelength-conversion-member mounting step S103, the wavelength-conversion member fabricated in wavelength-conversion-member fabrication step S102 is disposed on an LED-element mounting substrate fabricated in LED-element mounting step S101. The order of step S101 and step S102 may be reversed.

Although LED elements are used as light-emitting devices in the embodiments, the present invention is not limited to LED elements, and various light-emitting devices such as, for example, laser diode (LD) devices can be used.

Figure 1B:
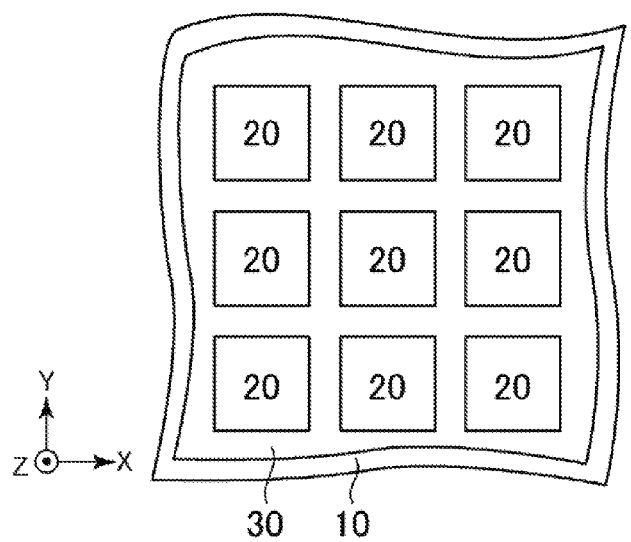
FIG. 1B is a schematic plan view of the light emitting device according to the first embodiment.

FIG. 1B is a schematic plan view of the light emitting devices according to the embodiments. The light emitting devices according to the embodiments include a substrate 10, a plurality of LED elements 20 that are arranged, for example, in a matrix on the substrate 10, and a wavelength-conversion member 30 that is disposed on the plurality of LED elements 20.

Note that, the shapes of the LED elements 20 in plan view (the shapes of the LED elements 20 when seen in the Z-axis direction) are, for example, rectangular shapes that are the same as one another, and the rectangular shape is a square shape as an example. The gaps between the LED elements 20 are equal to one another.

A method for manufacturing a light emitting device according to a first embodiment will now be described with reference to FIG. 2A to FIG. 4D. FIG. 2A to FIG. 2E correspond to LED-element mounting step S101. FIG. 3A to FIG. 3I correspond to wavelength-conversion-member fabrication step S102. FIG. 4A to FIG. 4D correspond to wavelength-conversion-member mounting step S103.

First, LED-element mounting step S101 will be described with reference to FIG. 2A to FIG. 2E.

Figure 2A:
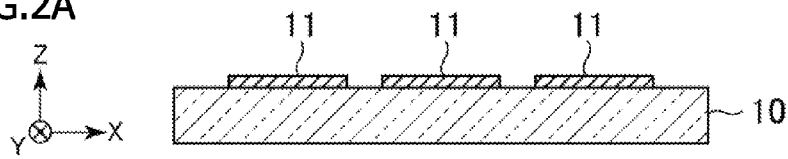
FIG. 2A to FIG. 2E are schematic sectional views illustrating an LED-element mounting step.

Referring to FIG. 2A, the substrate 10 on which metal patterns 11 are arranged is prepared. The substrate 10 is, for example, a Si substrate. In the first embodiment, a titanium/platinum/gold (Ti/Pt/Au) multilayer structure is employed in each of the metal patterns 11.

Figure 2B:
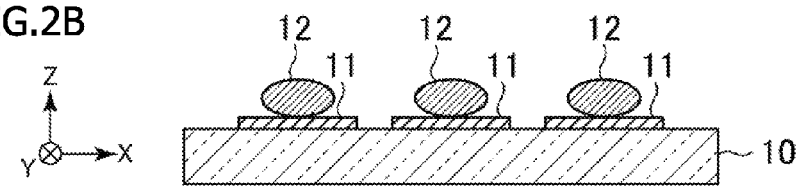

As illustrated in FIG. 2B, a gold-tin (AuSn) paste 12 is applied to the metal patterns 11 by using a dispenser.

Figure 2C:
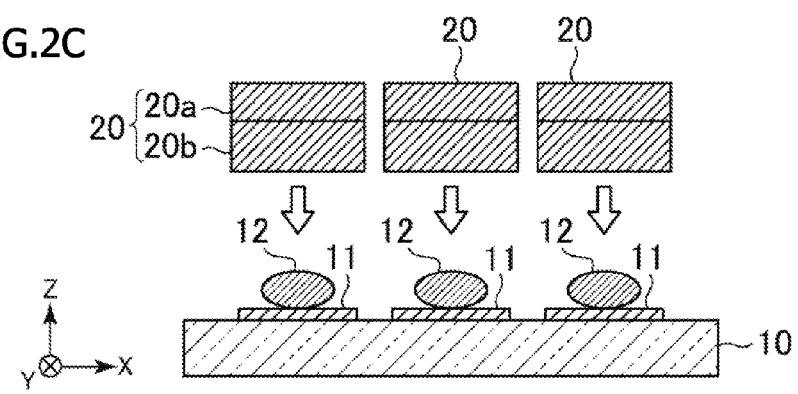

Referring to FIG. 2C, each of the LED elements 20 is disposed on a corresponding one of the metal patterns 11, to which the AuSn paste 12 has been applied.

Each of the LED elements 20 includes a support substrate 20b and a semiconductor layer 20a that is disposed on the support substrate 20b. The semiconductor layer 20a includes, for example, an n-type semiconductor layer, an active layer (light emitting layer), and a p-type semiconductor layer. An n-side electrode is electrically connected to the n-type semiconductor layer, and a p-side electrode is electrically connected to the p-type semiconductor layer. As an example, each of the LED elements 20 is a nitride-based semiconductor light-emitting element that emits blue light.

Figure 2D:
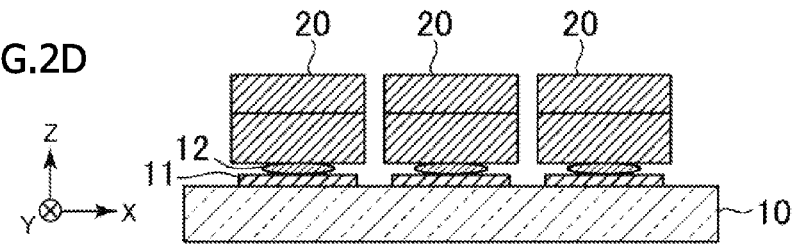

Referring to FIG. 2D, the substrate 10, on which the LED elements 20 are disposed, is subjected to a heat treatment at 315° C. in, for example, nitrogen so as to perform AuSn eutectic bonding.

Figure 2E:
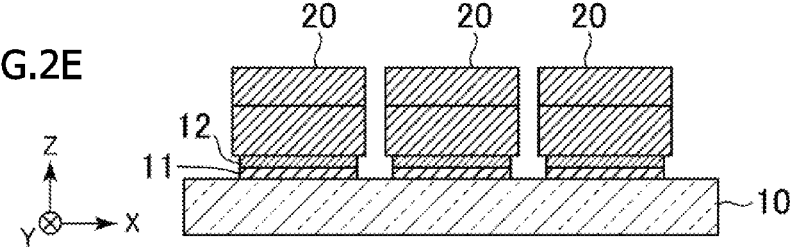

As a result, as illustrated in FIG. 2E, each of the plurality of LED elements 20 is mounted on the corresponding metal pattern 11 of the substrate 10 with a corresponding one of AuSn eutectic bonding layers 12 interposed therebetween.

Wavelength-conversion-member fabrication step S102 will now be described with reference to FIG. 3A to FIG. 3I.

Figure 3A:
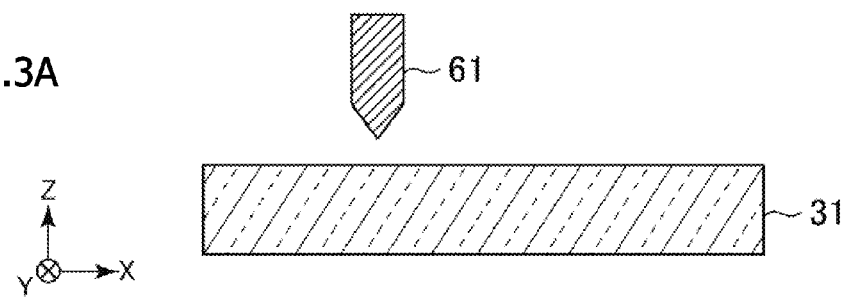
FIG. 3A to FIG. 3D are schematic sectional views illustrating a wavelength-conversion-member fabrication step.

Referring to FIG. 3A, a fluorescent support substrate 31 having a thickness of 200 μm is processed by using, for example, a drill 61 containing diamond abrasive grains so as to form protruding portions 32 (protruding structures). The fluorescent support substrate 31 is, for example, a glass substrate. Alternatively, a sapphire substrate may be used as the fluorescent support substrate 31. The protruding portions 32 may be formed by a grooving method using a dicing blade or by etching. In this manner, the fluorescent support substrate 31 having the protruding portions 32 is prepared.

Figure 3B:
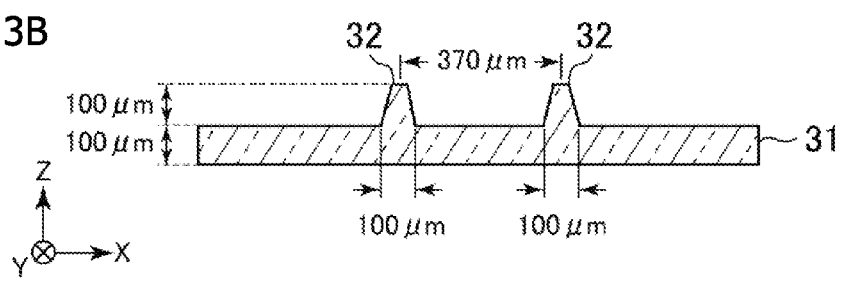

As illustrated in FIG. 3B, each of the protruding portions 32 is formed such that, for example, the width of a bottom surface of the protruding portion 32 is 100 μm, and the height of the protruding portion 32 is 100 μm. The distance from a bottom surface of the fluorescent support substrate 31 to the bottom surface of each of the protruding portions 32 (the thickness of a portion of the fluorescent support substrate 31, the portion being located at a position where no protruding portion 32 is formed) is 100 μm. Although it is preferable that side surfaces of the protruding portions 32 be inclined with respect to a direction normal to the fluorescent support substrate 31 (Z-axis direction), the side surfaces may be perpendicular to the fluorescent support substrate 31.

Note that a desired inclination angle of each of the side surfaces can be obtained by changing the shape of the tip of the machining drill 61. Also in the case of using a grooving method using a dicing blade, the shape of the tip of the blade may be changed in order to obtain a desired inclination angle. In the case of performing etching, the inclination angles of the side surfaces can be controlled by changing the reaction rate.

For example, the protruding portions 32 are formed in a grid-like pattern extending in two directions (X-axis direction and Y-axis direction) that are perpendicular to each other. For example, the protruding portions 32 are arranged at a pitch of 370 μm in the X-axis direction and in the Y-axis direction. Note that also the LED elements 20 on the substrate 10 are arranged at a pitch of 370 μm in the two directions (X-axis direction and Y-axis direction), which are perpendicular to each other. In other words, the arrangement pitch of the LED elements 20 and the arrangement pitch of the protruding portions 32 are equal to each other. The protruding portions 32 are formed in an arrangement corresponding to the arrangement of the LED elements 20.

Figure 3C:
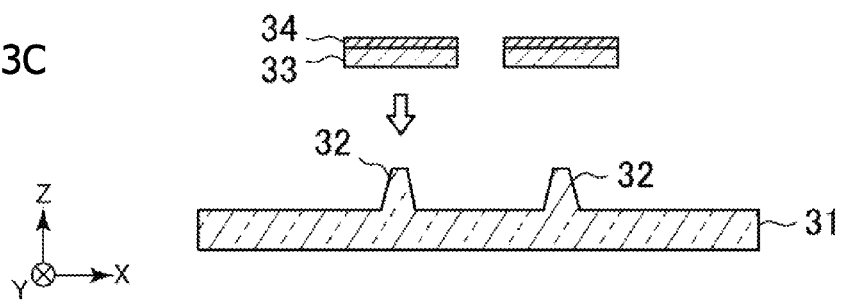

Referring to FIG. 3C, fluorescent layers 33 are prepared, and light blocking layers 34 are formed on the fluorescent layers 33. For example, a commonly known fluorescent sheet is used for each of the fluorescent layers 33, and as an example, a sheet made of a silicone resin having a property of being softened by heat and containing dispersed fluorescent particles is used. Each of the fluorescent layers 33 (fluorescent sheets) has a thickness of about 50 μm and is cut beforehand so as to fit the size of the corresponding protruding portion 32. In the first embodiment, each of the light blocking layers 34 is formed of a titanium oxide layer. Each of the light blocking layers 34 is formed by applying titanium oxide on one surface of the corresponding fluorescent layer 33 (fluorescent sheet) such that the titanium oxide has a thickness of about 10 μm and then performing a drying treatment at 80° C. for 30 minutes.

The fluorescent layers 33 are disposed on the protruding portions 32. The fluorescent layers 33 are placed on the fluorescent support substrate 31 such that surfaces of the fluorescent layers 33 cover the corresponding protruding portions 32, the surfaces of the fluorescent layers 33 being opposite to surfaces of the fluorescent layers 33 on which the light blocking layers 34 are formed.

Figure 3D:
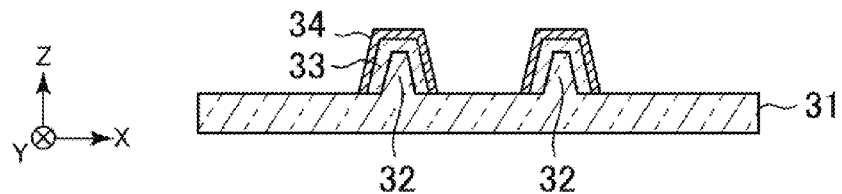

Referring to FIG. 3D, the protruding portions 32 and the corresponding fluorescent layers 33 are brought into close contact with each other by causing the fluorescent layers 33 to soften at a temperature of 100° C. or higher. The fluorescent layers 33 are formed on the top surfaces and the side surfaces of the protruding portions 32 of the fluorescent support substrate 31, and the light blocking layers 34 are formed on the fluorescent layers 33. Note that, for example, the protruding portions 32 and the fluorescent layers 33 may be brought into close contact with each other by applying an external force from the side of the light blocking layers 34 and then causing the fluorescent layers 33 to soften.

Figure 3E:
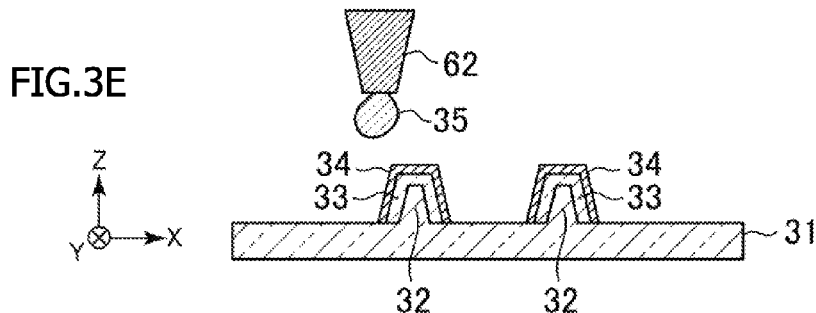
FIG. 3E to FIG. 3I are schematic sectional views illustrating the wavelength-conversion-member fabrication step.

Referring to FIG. 3E, a fluorescent-substance-dispersion liquid 35 is applied to the fluorescent support substrate 31 including regions in which the protruding portions 32 are formed, specifically, to the entirety of the fluorescent support substrate 31 having the protruding portions 32, on which the fluorescent layers 33 and the light blocking layer 34 have been formed. The fluorescent-substance-dispersion liquid 35 is fabricated by, for example, dispersing fluorescent particles in a resin solution made of a silicone, and the substance-dispersion liquid 35 is ejected onto the fluorescent support substrate 31 from a dispenser nozzle 62 (dispensing method).

For example, as the fluorescent particles dispersed in the fluorescent-substance-dispersion liquid 35, fluorescent substances that are the same type as the fluorescent particles included in the fluorescent layers 33 are used. The fluorescent substances converts, by wavelength conversion, the blue light emitted by the LED elements 20 into light (e.g., yellow light) having the same wave length as that of the blue light. In addition, for example, the density of the fluorescent particles dispersed in the fluorescent-substance-dispersion liquid 35 is set to be the same as the density of the fluorescent particles dispersed in each of the fluorescent layers 33 so as to set the wavelength conversion efficiency in the fluorescent-substance-dispersion liquid 35 and the wavelength conversion efficiency in each of the fluorescent layers 33 to be the same as each other.

Figure 3F:
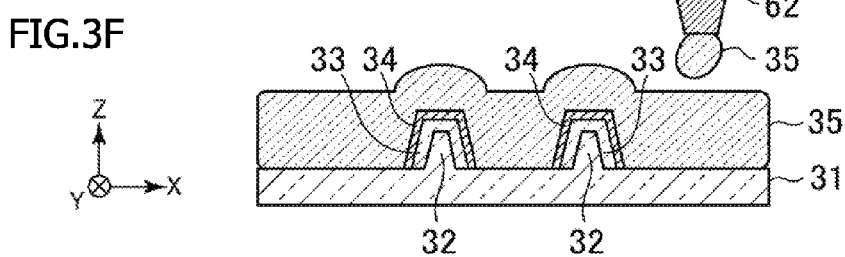

Referring to FIG. 3F, the thickness of the fluorescent-substance-dispersion liquid 35, which is applied to the fluorescent support substrate 31, is for example, 200 μm. After applying the fluorescent-substance-dispersion liquid 35, a drying treatment is performed at 120° C. for 90 minutes, and a fluorescent layer 35 is formed. By performing this treatment, the fluorescent layers 33 are also dried and hardened, and as a result, the fluorescent layers 33 are completely fixed onto the corresponding protruding portions 32.

Figure 3G:
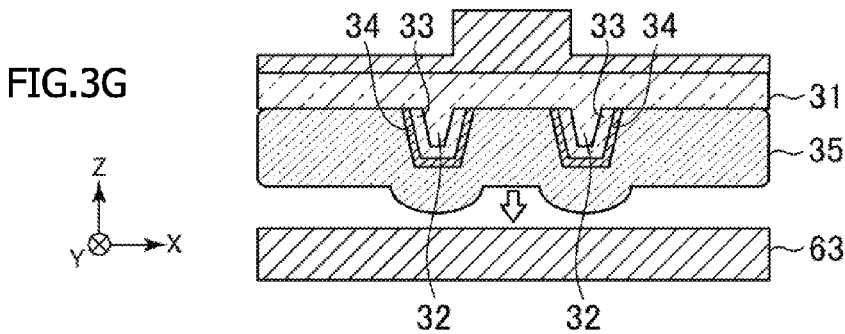

Referring to FIG. 3G, the fluorescent layer 35 is ground by using a grinding surface plate 63.

Figure 3H:
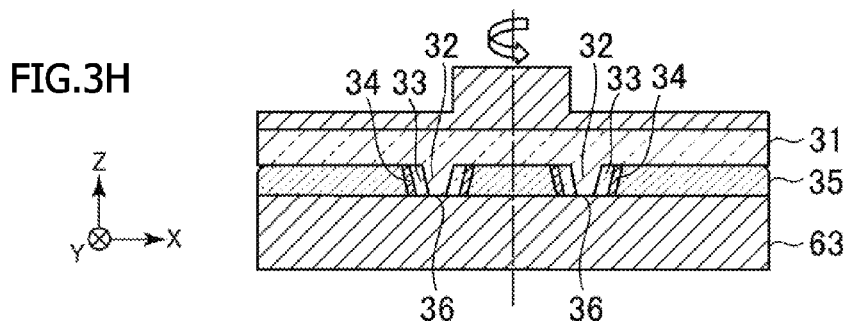

Referring to FIG. 3H, by performing the grinding operation, portions of the fluorescent layers 33 on the top surfaces of the protruding portions 32 and portions of the light blocking layers 34 on the portions of the fluorescent layers 33 are removed, and openings 36 are formed. The openings 36 are exposed portions of the fluorescent support substrate 31 (the protruding portions 32), that is, exposed regions in a surface of the fluorescent support substrate 31, the surface facing the fluorescent layer 35. The grinding (thinning) operation is performed until the thickness of the fluorescent layer 35 (the height of each of the protruding portions 32) is reduced to 50 μm. In this case, the width of the top surface of each of the protruding portions 32 is, for example, 65 μm. The cross-sectional shape of each of the protruding portions 32 is trapezoidal with an upper base, lower base, and height of 65 μm, 100 μm, and 50 μm, respectively.

Figure 3I:
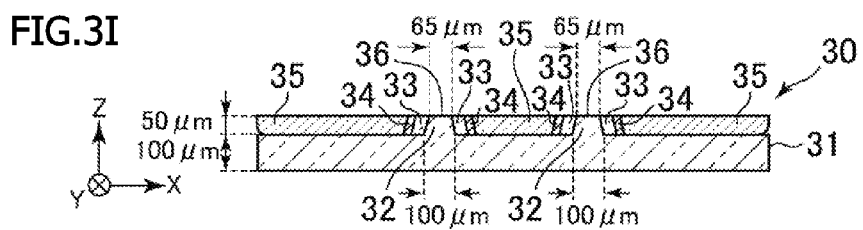

FIG. 3I is a schematic sectional view illustrating the wavelength-conversion member 30.

The wavelength-conversion member 30 includes the fluorescent support substrate 31, which includes the protruding portions 32, the fluorescent layers (first fluorescent layers) 33, which are formed on the side surfaces (side wall portions) of the protruding portions 32, the fluorescent layer (second fluorescent layer) 35, which is formed on the fluorescent support substrate 31 excluding the protruding portions 32, and the light blocking layers 34, which are formed between each of the first fluorescent layers 33 and the second fluorescent layer 35.

Wavelength-conversion-member mounting step S103 will now be described with reference to FIG. 4A to FIG. 4D. In step S103, the LED-element mounting substrate fabricated in step S101 and the wavelength-conversion member 30 fabricated in step S102 are bonded together with a bonding layer interposed therebetween. The wavelength-conversion member 30 is disposed on or above the LED elements 20.

Figure 4A:
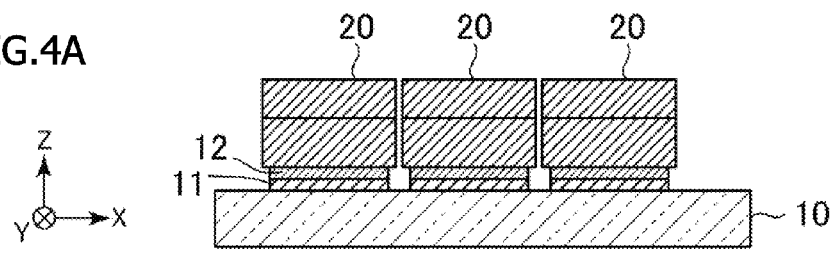
FIG. 4A to FIG. 4D are schematic sectional views illustrating a wavelength-conversion-member mounting step.

As illustrated in FIG. 4A, an LED mounting substrate is prepared. Although the LED-element mounting substrate fabricated in step S101 is used in the first embodiment, the present invention is not limited to this.

Figure 4B:
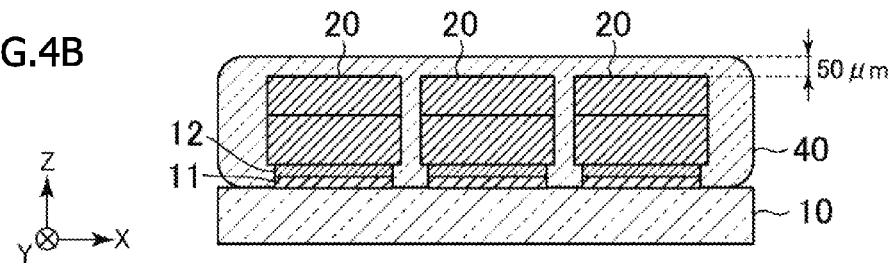

Referring to FIG. 4B, a bonding layer 40 made of a silicone resin is formed on the LED-element mounting substrate. The thickness of the bonding layer 40 from light-emitting surfaces of the LED elements 20 is, for example, 50 μm. In the finished light emitting device according to the first embodiment, it is preferable that the bonding layer 40 be formed so as to be thin from the standpoint of improving the heat dissipation performance of the fluorescent layers 33 and 35.

Figure 4C:
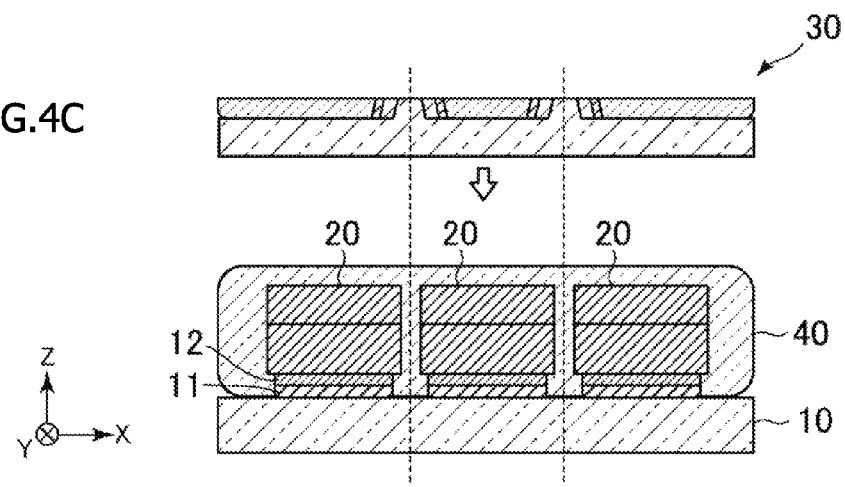

As illustrated in FIG. 4C, the position of the wavelength-conversion member 30 is adjusted, and the wavelength-conversion member 30 is disposed on the LED-element mounting substrate (bonding layer 40). The position of the wavelength-conversion member 30 is adjusted such that, when seen in plan view (when seen in the Z-axis direction), the centers of the protruding portions 32 of the wavelength-conversion member 30 in a width direction (the centers of the openings 36 in the width direction) coincide with the centers of the corresponding regions between the LED elements 20 of the LED-element mounting substrate.

Figure 4D:
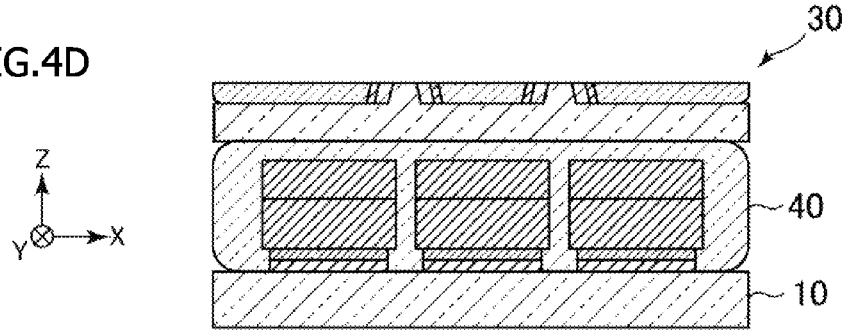

Referring to FIG. 4D, by performing a drying treatment at 150° C. for 90 minutes, the wavelength-conversion member 30 is fixed in place.

The light emitting device according to the first embodiment is manufactured through the above steps.

Figure 5:
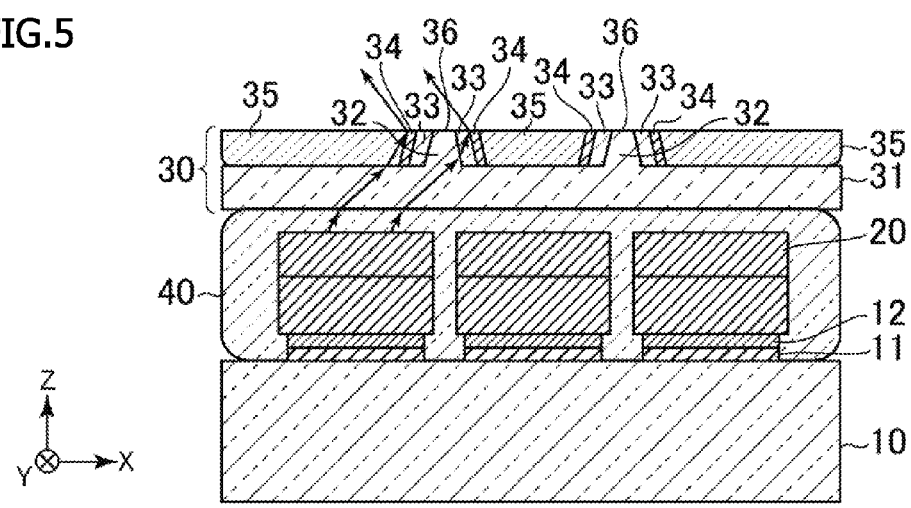
FIG. 5 is a schematic sectional view illustrating the light emitting device according to the first embodiment.

FIG. 5 is a schematic sectional view illustrating the light emitting device according to the first embodiment.

In the light emitting device according to the first embodiment, the LED elements 20 are arranged in a matrix on the substrate 10, for example, at a certain pitch in the X-axis direction and the Y-axis direction. The wavelength-conversion member 30 is disposed on the LED elements 20 with the bonding layer 40 interposed therebetween. A driving signal (power) is supplied to each of the LED elements 20 from the driving circuit via the metal patterns 11. The LED elements 20 can be driven independently of one another, that is, independent control of the LED elements 20 in a light-emitting state and in a non-light-emitting state can be performed.

The wavelength-conversion member 30 includes the fluorescent support substrate 31, which includes the protruding portions 32, the first fluorescent layers 33, which are formed on the side surfaces of the protruding portions 32, the second fluorescent layer 35, which is formed on the fluorescent support substrate 31 excluding the protruding portions 32, and the light blocking layers 34, which are formed between each of the first fluorescent layers 33 and the second fluorescent layer 35. The first fluorescent layers 33 and the light blocking layers 34 are positioned so as to follow the shapes of the corresponding protruding portions 32.

The first fluorescent layers 33 and the second fluorescent layer 35 include, for example, the same fluorescent particles and convert the blue light emitted by the LED elements 20 into yellow light by wavelength conversion.

The light blocking layers 34 are made of, for example, titanium oxide and partition the fluorescent region into a plurality of regions (the first fluorescent layers 33 and the second fluorescent layer 35). Light incident on the light blocking layers 34 is reflected with high reflectance.

The protruding portions 32 protrude from the fluorescent support substrate 31 in the positive Z-axis direction (direction toward a light-emitting surface of the light emitting device). In addition, the protruding portions 32 are formed in a grid-like pattern extending in the X-axis direction and the Y-axis direction. The arrangement pitch of the protruding portions 32 in the X-axis direction and the Y-axis direction is equal to that of the LED elements 20.

When seen in plan view, the protruding portions 32 are arranged such that the centers of the protruding portions 32 in the width direction coincide with the centers of the corresponding regions between the LED elements 20. Thus, the light blocking layers 34 are positioned so as to be closer than the centers of the corresponding regions between the LED elements 20 to the centers of the corresponding LED elements 20. When two of the LED elements 20 that are adjacent to each other are seen, the corresponding light blocking layers 34 are each located at a position close to one of the two LED elements 20 (in the positive X-axis direction and a negative X-axis direction in FIG. 5) while the center of the region between the two LED elements 20 functions as a reference. In addition, in the first embodiment, the light blocking layers 34 are located at positions that are superposed with the corresponding LED elements 20 when seen in plan view.

The blue light that is emitted by the LED elements 20 and that is incident on the fluorescent particles of the first and second fluorescent layers 33 and 35 is converted into yellow light by wavelength conversion. The yellow light obtained by the wavelength conversion and the blue light that was not incident on the fluorescent particles are emitted from a top surface of the wavelength-conversion member 30 and visually recognized as white light.

In the light emitting device according to the first embodiment, light (waveguide light) that travels from, for example, the second fluorescent layer 35 in the lateral direction (direction in which the LED elements 20 are adjacent to one another) is blocked by the light blocking layers 34, specifically, by the light blocking layers 34 each having a light-reflecting function, and thus, the occurrence of cross talk is suppressed. Light that is incident on the first fluorescent layers 33 is reflected by, for example, the light blocking layers 34 and is emitted above the protruding portions 32 (above the regions between the LED elements 20), and thus, the area of a dark portion that will be formed in the regions between the LED elements 20 (non-light-emitting regions) is reduced.

The light emitting device according to the first embodiment is a light emitting device that is capable of reducing the probability of the occurrence of cross talk and reducing the area of a dark portion. According to the light emitting device of the first embodiment, for example, the accuracy with which a light emitting pattern is formed can be improved. Note that, it is not necessary to increase the gaps between the LED elements 20 more than, for example, those in the light emitting device of the related art illustrated in FIG. 12.

According to the method for manufacturing the light emitting device according to the first embodiment, since the first fluorescent layers 33 and the light blocking layers 34 are arranged by using the protruding portions 32, the light blocking layers 34, which are thin, can be arranged at appropriate positions with high positional accuracy.

In the light emitting device according to the first embodiment, it is preferable that the inclination angle of each of the side surfaces of the protruding portions 32, each having a tapered shape, be 0 degrees or larger and 45 degrees or smaller with respect to the direction normal to the fluorescent support substrate 31 (Z-axis direction). In the case where the inclination angle is larger than 45 degrees, light-extraction efficiency is reduced. In the case of performing either mechanical processing (grinding or the like) or chemical processing (etching or the like), the protruding portions 32 can be easily formed by setting the inclination angle of each of the side surfaces to be 0 degrees or larger so as not to cause each of the protruding portions 32 to have an inverted tapered shape. Note that in the case where the inclination angle is 0 degrees (i.e., the side surfaces are perpendicular to the fluorescent support substrate 31), the amount of blue light absorbed by the fluorescent particles is reduced, and the intensity of blue color increases. This causes color unevenness, and thus, it is further preferable that the inclination angle be larger than 0 degrees (it is further preferable that the side surfaces of the protruding portions 32 be not perpendicular to the fluorescent support substrate 31).

When the inclination angle is excessively large, the angle of each of the light blocking layers 34 becomes closer to the angle of the corresponding light-emitting surface such that the light blocking layer 34 and the light-emitting surface are parallel to each other. Thus, the area of a light transmission region is reduced, and accordingly, light emitting efficiency is reduced.

In the case where each of the protruding portions 32 has an inverted tapered shape, it is difficult to perform a sheet attaching method, and accordingly, it is difficult to bring a sheet into close contact with an inclined portion, which in turn leads to separation of the sheet and the inclined portion from each other.

The light blocking layers 34 can be made of a metal (reflective member) other than titanium oxide, examples of the metal including Al, Ag, Pt, and the like each having high reflectivity.

Alternatively, the light blocking layers 34 can be formed so as to make use of differences between refractive indices. As an example, the light blocking layers 34 are made of a resin material having a relatively low refractive index (e.g., a fluorocarbon resin having a refractive index of 1.35), and the first and second fluorescent layers 33 and 35 are made of a resin material having a relatively high refractive index (e.g., dimethyl silicone having a refractive index of 1.5). The refractive indices of the layers are set so that the refractive index of second fluorescent layer 35>the refractive index of light blocking layer 34<the refractive index of first fluorescent layer 33, and by making use of light reflection caused by the differences between the refractive indices, suppression of the occurrence of cross talk can be facilitated. Note that, in the case where the light blocking layers 34 make use of differences between refractive indices, light leakage occurs, and thus, it is preferable that each of the light blocking layers 34 be formed of a reflective member.

In the light emitting device according to the first embodiment, for example, the density of the fluorescent particles in each of the first fluorescent layers 33 and the density of the fluorescent particles in the second fluorescent layer 35 are equal to each other, so that the wavelength conversion efficiency in each of the first fluorescent layers 33 and the wavelength conversion efficiency in the second fluorescent layer 35 are the same as one another. However, as an example, the wavelength conversion efficiency may be reduced by reducing the density of the fluorescent particles in the fluorescent regions (first fluorescent layers 33 in the first embodiment) that are located above the regions between the LED elements 20 or that are located in the vicinity of regions above the regions between the LED elements 20.

Figure 12:
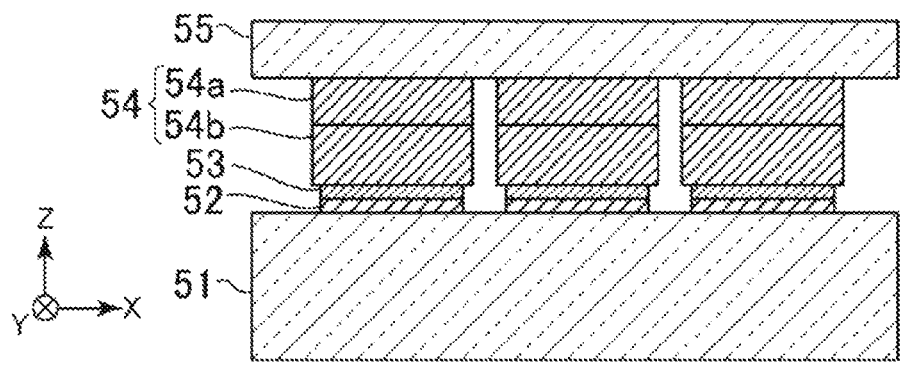
FIG. 12 is a schematic sectional view illustrating a semiconductor light emitting device of the related art.

For example, in the light emitting device of the related art illustrated in FIG. 12, the intensity of the blue light in each of the regions between the LED elements 54 is less than that in each of the regions directly above the LED elements 54, and the yellow light is propagated within the fluorescence layer 55. Therefore, the intensity of the yellow color of the light emitted from above the regions between the LED elements 54 is high.

By setting the wavelength conversion efficiency in the fluorescent regions (first fluorescent layers 33) that are located above the regions between the LED elements 20 or that are located in the vicinity of regions above the regions between the LED elements 20 to be lower than that in the fluorescent region (second fluorescent layer 35) that is located above the centers of the LED elements 20 or that is located in the vicinity of regions above the centers of the LED elements 20, a light emitting device that emits more uniform white light can be obtained.

FIG. 6A to FIG. 6F are schematic plan views illustrating exemplary arrangements of the light blocking layers 34. In FIG. 6A to FIG. 6F, two of the LED elements 20 that are adjacent to each other in the X-axis direction are illustrated, and the positions at which the light blocking layers 34 are arranged are diagonally shaded.

Figure 6A:
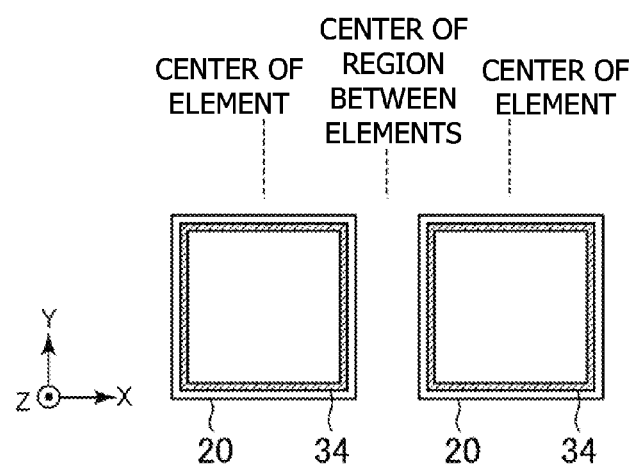
FIG. 6A to FIG. 6D are schematic plan views illustrating exemplary arrangements of light blocking layers.

FIG. 6A illustrates one of the arrangements of the light blocking layers 34 in the light emitting device according to the first embodiment. Each of the light blocking layers 34 is disposed on the inner side of a corresponding one of the LED elements 20 along the outline of the LED element 20. Each of the light blocking layers 34 is superposed with a circumferential edge portion of the corresponding LED element 20 (light-emitting region).

Figure 6B:
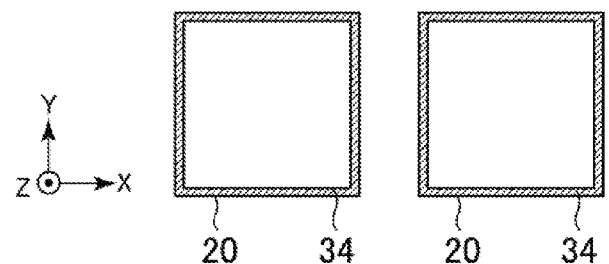

As illustrated in FIG. 6B, each of the light blocking layers 34 may be arranged so as to be in contact internally with the outline of the corresponding LED element 20. Each of the light blocking layers 34 is superposed with the circumferential edge portion of the corresponding LED element 20.

Figure 6C:
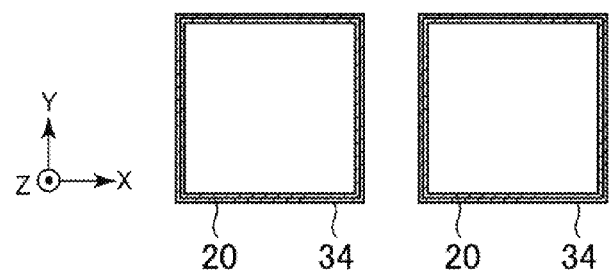

FIG. 6C illustrates the case where each of the light blocking layers 34 is formed so as to extend across the outline of the corresponding LED element 20. Each of the light blocking layers 34 is superposed with the circumferential edge portion of the corresponding LED element 20 and the region between the LED elements 20.

Figure 6D:
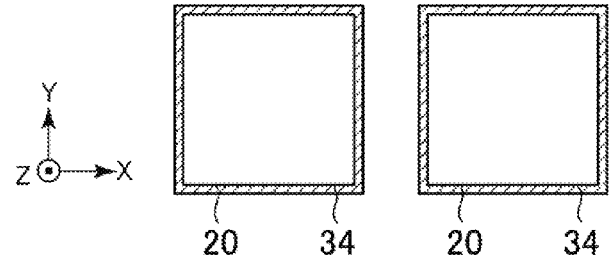

As illustrated in FIG. 6D, each of the light blocking layers 34 may be arranged so as to be in contact externally with the outline of the corresponding LED element 20. Each of the light blocking layers 34 is superposed with the region between the LED elements 20.

Figure 6E:
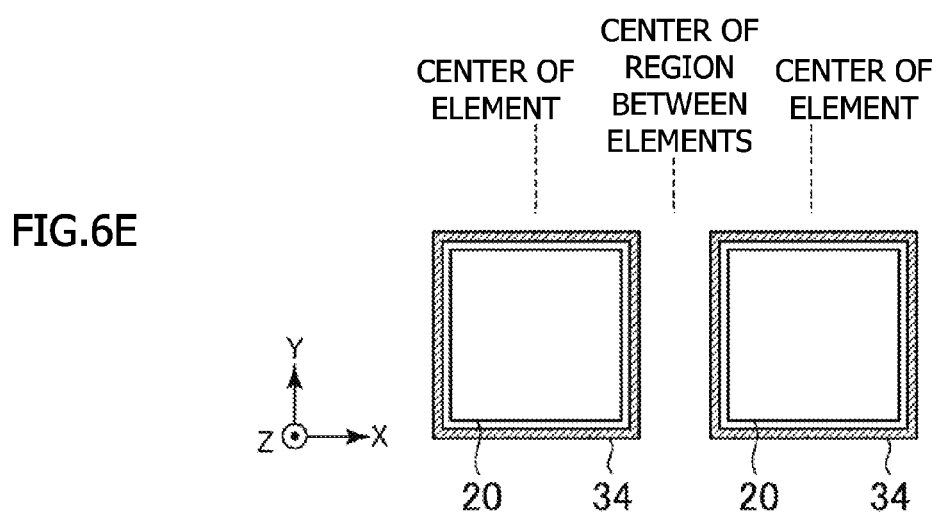
FIG. 6E and FIG. 6F are schematic plan views illustrating exemplary arrangements of the light blocking layers.

FIG. 6E illustrates the case where each of the light blocking layers 34 is disposed in a region outside the corresponding LED element 20 (the region between the LED elements 20) along the outline of the corresponding LED element 20.

Figure 6F:
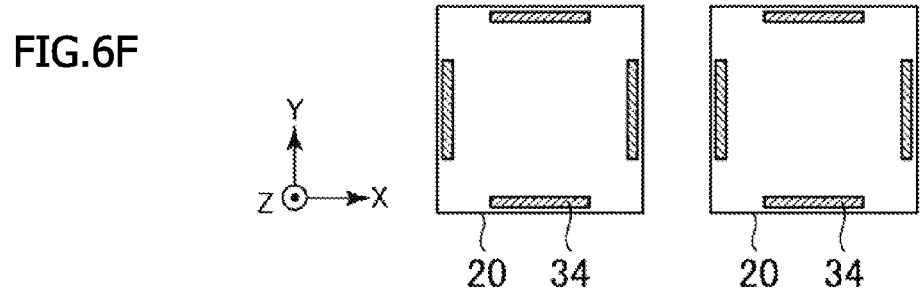

Although FIG. 6A to FIG. 6E illustrate the arrangements of the light blocking layers 34 in the case where the protruding portions 32 are continuously formed in a grid-like pattern, the protruding portions 32 may be discontinuously (discretely) formed. FIG. 6F illustrates an exemplary arrangement of the light blocking layers 34 in the case where the protruding portions 32 are discontinuously (discretely) formed in a grid-like pattern.

In the example illustrated in FIG. 6F, the protruding portions 32, the first fluorescent layers 33 and the light blocking layers 34 are not formed on four corner portions of the corresponding LED elements 20 each having a rectangular shape. In this case, the second fluorescent layer 35 that is continuous with the first fluorescent layers 33 is formed on the four corner portions of the LED elements 20.

According to the configurations illustrated in FIG. 6A to FIG. 6F, as an example, when seen in plan view, fluorescent regions that are superposed with the centers of the corresponding LED elements 20 and fluorescent regions that are superposed with the regions between the LED elements 20 can be formed.

Note that, although the protruding portions 32 and the light blocking layers 34 are arranged along the outlines of the LED elements 20 (light-emitting regions) in the examples illustrated in FIG. 6A to FIG. 6F, the protruding portions 32 and the light blocking layers 34 are not necessarily arranged along the outlines.

Advantageous effects of the light emitting device according to the first embodiment and the positions at which the light blocking layers 34 are disposed will now be additionally described with reference to FIG. 7A to FIG. 7D.

Figure 7A:
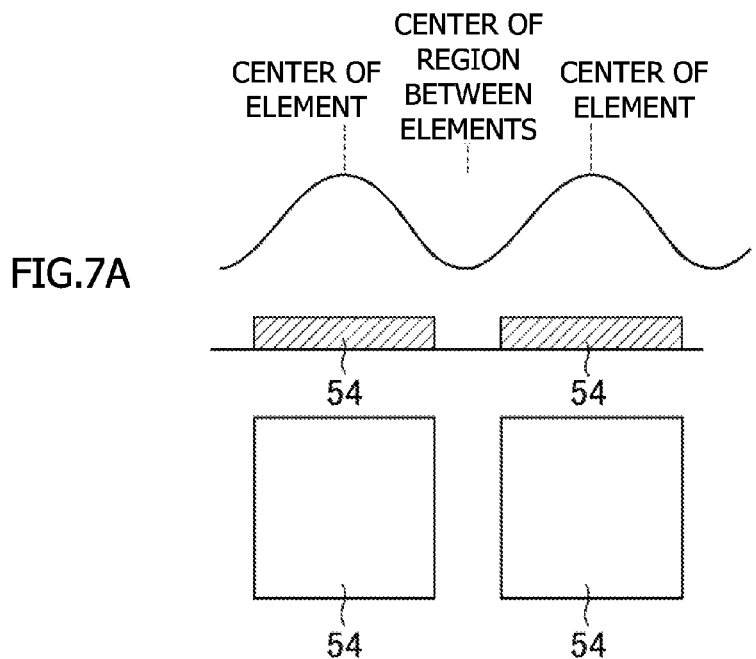
FIG. 7A to FIG. 7C are schematic diagrams illustrating advantageous effects of the light emitting device according to the first embodiment and the positions at which the light blocking layers are disposed.

FIG. 7A is a schematic diagram illustrating a light intensity distribution of the light emitting device of the related art illustrated in FIG. 12.

For example, the intensity of light emitted by the light emitting device is highest at the centers of the LED elements 54 and is lowest at the centers of the regions between the LED elements 54. FIG. 7A illustrates the light intensity distribution in the case where both two of the LED elements 54 that are adjacent to each other are turned on. However, in the case where only one of the two LED elements 54 is turned on, the intensity of the light is, for example, highest at the center of the turned-on LED element 54 and decreases with increasing distance from the center of the turned-on LED element 54.

In the light emitting device of the related art illustrated in FIG. 12, for example, light emitted by one of the LED elements 54 that is turned on is propagated through the fluorescence layer 55 to the regions of the other LED elements 54 that are not turned on, and as a result, cross talk occurs.

Figure 7B:
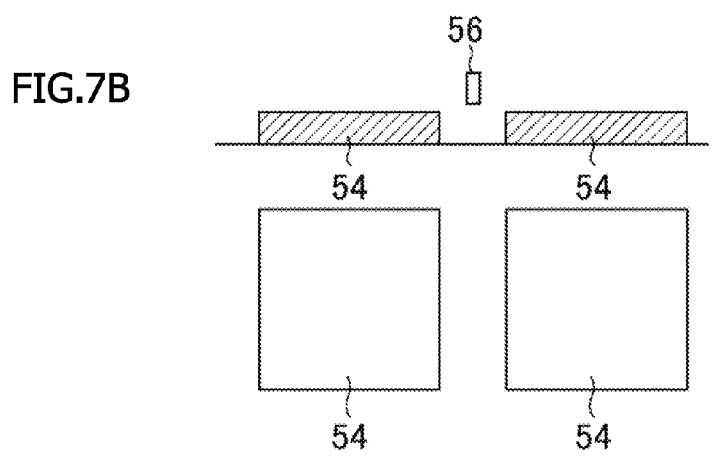

Referring to FIG. 7B, assume the case where a light blocking layer 56 is disposed in the fluorescence layer 55 of the light emitting device illustrated in FIG. 12. The position at which the light blocking layer 56 is disposed is the position of the center of the region between two of the LED elements 54.

The occurrence of cross talk is suppressed by the light blocking layer 56. However, the light blocking layer 56 is arranged at the position of the center of the region between the LED elements 54 at which the intensity of the light is lowest when both the adjacent two LED elements 54 are turned on, and consequently, this arrangement is likely to be a cause of formation of a dark portion.

Figure 7C:
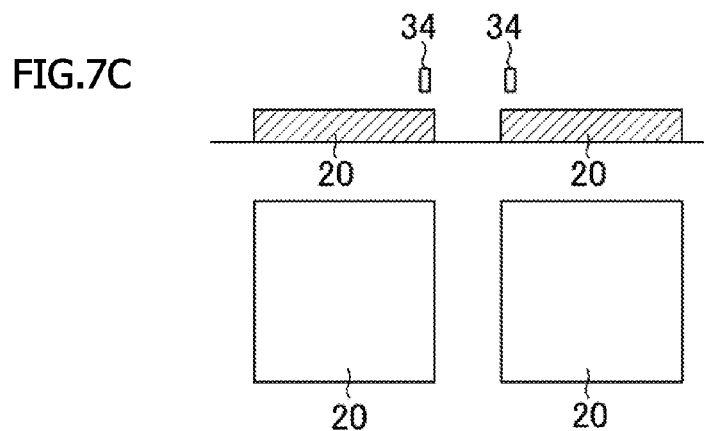

FIG. 7C illustrates the arrangement of the light blocking layers 34 in the light emitting device according to the first embodiment. In the light emitting device according to the first embodiment, when adjacent two of the LED elements 20 are seen, each of the light blocking layers 34 is positioned so as to be closer than the center of the region between the two LED elements 20 to the center of the corresponding LED element 20 while the center of the region between the two LED elements 20 functions as a reference. Since each of the light blocking layers 34 is arranged at a position at which the intensity of the light is higher than that at the center of the region between the LED elements 20, this arrangement is less likely to be a cause of formation of a dark portion. In particular, in the first embodiment, when seen in plan view, each of the light blocking layers 34 is arranged at a position that is superposed with the corresponding LED element 20 (a position at which the intensity of the light is higher than that at the region between the LED elements 20), and thus, this arrangement is further less likely to be a cause of formation of a dark portion.

Figure 7D:
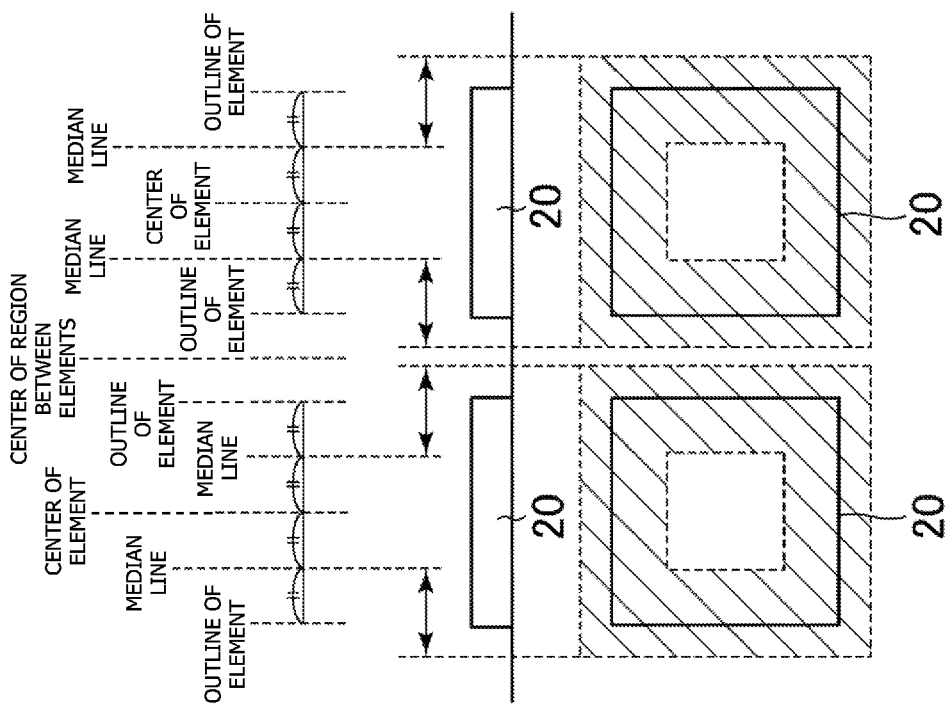
FIG. 7D is a schematic diagram illustrating advantageous effects of the light emitting device according to the first embodiment and the positions at which the light blocking layers are disposed.

Referring to FIG. 7D, from the standpoint of suppressing the occurrence of cross talk, it is preferable that each of the light blocking layers 34 be arranged at a position that is spaced apart from the center of the corresponding LED element 20. For example, it is preferable that each of the light blocking layers 34 be arranged at a position on the side opposite to the side on which the center of the corresponding LED element 20 is present while the median line between the center of the LED element 20 (light-emitting region) and the outline of the LED element 20 (light-emitting region), which is the path of the midpoint between the center of the LED element 20 (light-emitting region) and a point on the outline of the LED element 20 (light-emitting region), function as references. In FIG. 7D, the positions at which the light blocking layers 34 are preferably arranged are diagonally shaded.

Figure 8:
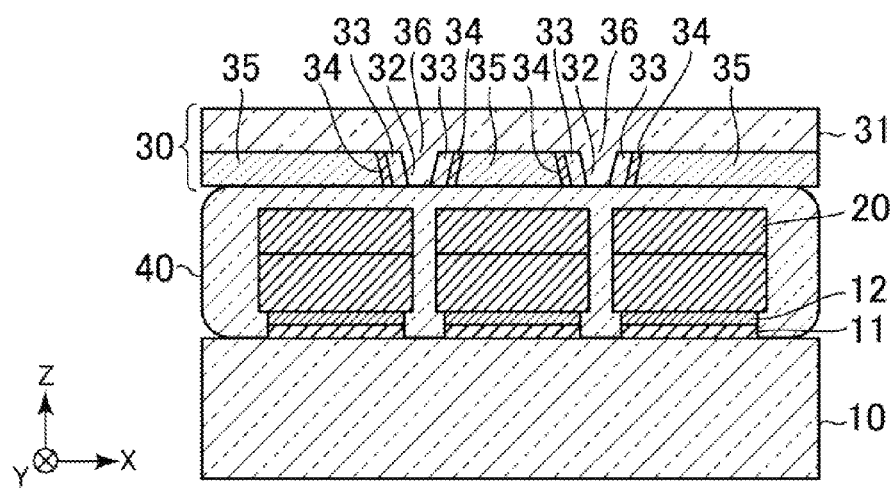
FIG. 8 is a schematic sectional view illustrating a light emitting device according to a modification of the first embodiment.

FIG. 8 is a schematic sectional view illustrating a light emitting device according to a modification of the first embodiment.

In the modification of the first embodiment, the wavelength-conversion member 30, which is fabricated in the step illustrated in FIG. 3A to FIG. 3I, is disposed, by turning its representation in the first embodiment upside down, on the LED-element mounting substrate (bonding layer 40). In other words, although in the first embodiment, the wavelength-conversion member 30 is disposed on the LED-element mounting substrate such that the fluorescent support substrate 31 faces the LED-element mounting substrate, in the present modification, the wavelength-conversion member 30 is disposed on the LED-element mounting substrate such that the surface of the wavelength-conversion member 30 on the side on which the first and second fluorescent layers 33 and 35 and the light blocking layers 34 are formed faces the LED-element mounting substrate.

The other steps are similar to those in the first embodiment, the steps including arranging the wavelength-conversion member 30 such that, when seen in plan view, the centers of the protruding portions 32 of the wavelength-conversion member 30 in the width direction coincide with the centers of the corresponding regions between the LED elements 20 of the LED-element mounting substrate, and the light emitting device according to the modification can be manufactured through the steps.

In the modification of the first embodiment, heat generated by the first and second fluorescent layers 33 and 35 is dissipated to the side on which the substrate 10 is disposed not via the fluorescent support substrate 31, but via the bonding layer 40 and the LED elements 20, and thus, a light emitting device having good heat dissipation performance can be obtained.

Note that, also in the light emitting device according to the first embodiment, the heat dissipation performance can be improved by setting the thickness (100 μm in the first embodiment) of the fluorescent support substrate 31 to be small. By forming the fluorescent support substrate 31 so as to be thin, an advantageous effect of suppressing the occurrence of cross talk can also be obtained. For example, by setting the thickness of the fluorescent support substrate 31 to 80 μm or smaller, a light emitting device that has good heat dissipation performance and that is capable of further suppressing the occurrence of cross talk can be obtained.

A light emitting device according to a second embodiment will now be described with reference to FIG. 9A to FIG. 9C.

A method for manufacturing the light emitting device according to the second embodiment is similar to the method for manufacturing the light emitting device according to the first embodiment except that the thickness of each of the first fluorescent layers (fluorescent sheets) 33 is set to 200 μm and that the grinding amount of the second fluorescent layer 35 is reduced in a step corresponding to that illustrated in FIG. 3H.

Figure 9A:
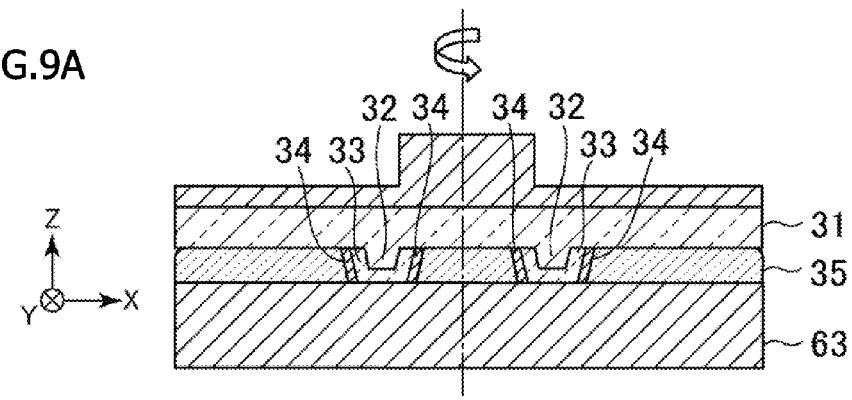
FIG. 9A to FIG. 9C are schematic sectional views illustrating a light emitting device according to a second embodiment.

FIG. 9A is a schematic sectional view illustrating a grinding step corresponding to that illustrated in FIG. 3H.

In the first embodiment, the light blocking layers 34 and the first fluorescent layers 33 on the top surfaces of the protruding portions 32 are removed by grinding, and the openings 36 are formed. However, such openings are not formed in the second embodiment. Although, in both the first and second embodiments, the second fluorescent layer 35 is ground to a thickness at which at least the light blocking layers 34 are removed, in the second embodiment, the first fluorescent layers 33 are left on the top surfaces of the protruding portions 32. In the second embodiment, the second fluorescent layer 35 is ground until the thickness of the second fluorescent layer 35 is reduced to, for example, 150 μm. By performing the grinding operation, the light blocking layers 34 and portions of the first fluorescent layers 33 are removed as well as the second fluorescent layer 35 at the positions of the protruding portions 32.

Figure 9B:
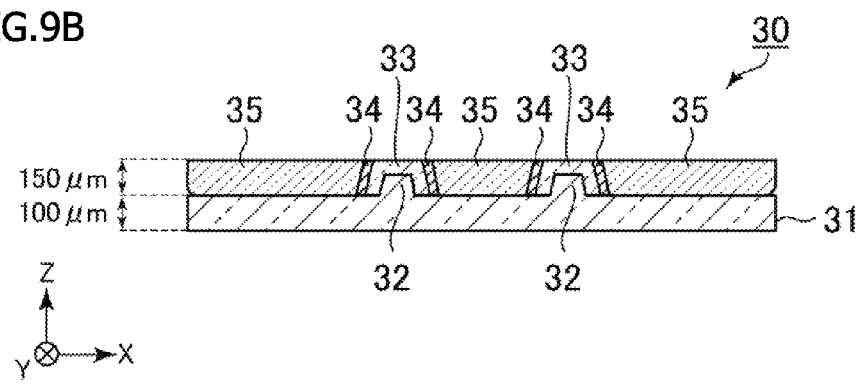

FIG. 9B is a schematic sectional view illustrating the wavelength-conversion member 30 according to the second embodiment.

The wavelength-conversion member 30 includes the fluorescent support substrate 31 that includes the protruding portions 32, the first fluorescent layers 33 that are formed on the side surfaces and the top surfaces of the protruding portions 32, the second fluorescent layer 35 that is formed on the fluorescent support substrate 31 excluding the protruding portions 32, and the light blocking layers 34 that are formed between each of the first fluorescent layers 33 and the second fluorescent layer 35. The first fluorescent layers 33 and the light blocking layers 34 are arranged along the corresponding protruding portions 32.

Figure 9C:
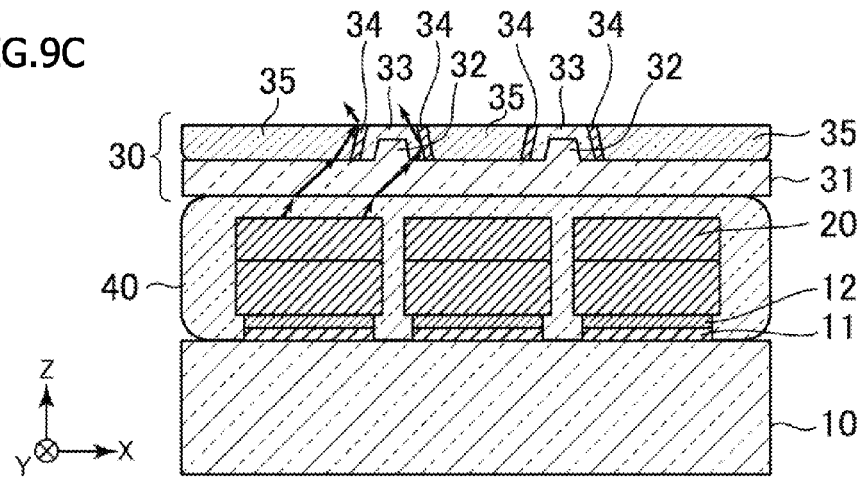

FIG. 9C is a schematic sectional view illustrating the light emitting device according to the second embodiment. The configuration of the light emitting device according to the second embodiment excluding the wavelength-conversion member 30 is the same as the configuration of the light emitting device according to the first embodiment.

Also in the light emitting device according to the second embodiment, for example, light that travels from the second fluorescent layer 35 in the lateral direction is reflected by the light blocking layers 34, and thus, the occurrence of cross talk is suppressed. In addition, light that is incident on the first fluorescent layers 33 is reflected by, for example, the light blocking layers 34 and is emitted above the protruding portions 32 (above the regions between the LED elements 20), and thus, the area of a dark portion that will be formed in the regions between the LED elements 20 (non-light-emitting regions) is reduced.

The light emitting device according to the second embodiment is also a light emitting device that is capable of reducing the probability of the occurrence of cross talk and reducing the area of a dark portion.

In addition, in the second embodiment, since no opening is formed in the wavelength-conversion member 30, blue light will not penetrate an opening and will not be directly emitted. Therefore, a more uniform light-emitting state than that in the light emitting device according to the first embodiment can be obtained.

Figure 10:
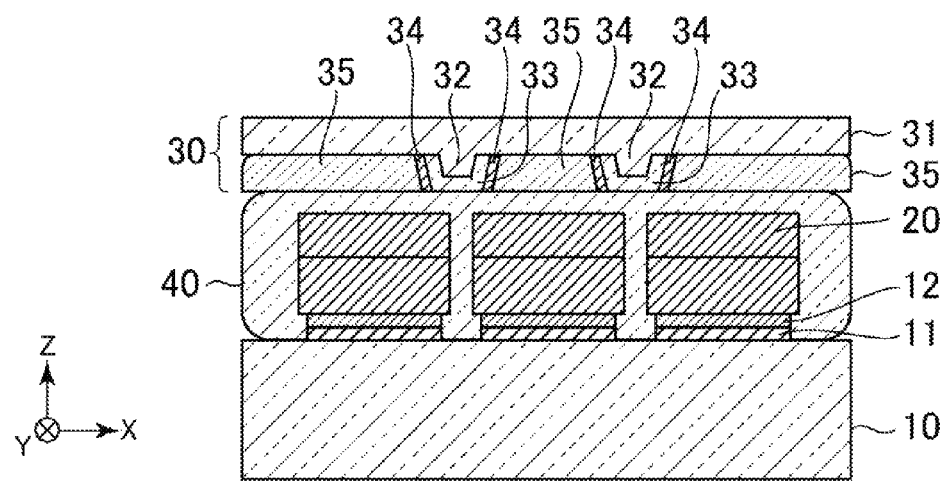
FIG. 10 is a schematic sectional view illustrating a light emitting device according to a modification of the second embodiment.

FIG. 10 is a schematic sectional view illustrating a light emitting device according to a modification of the second embodiment.

In the modification of the second embodiment, the wavelength-conversion member 30 that is the same as that in the second embodiment is disposed, by turning its representation in the second embodiment upside down, on the LED-element mounting substrate (bonding layer 40). In other words, although in the second embodiment, the wavelength-conversion member 30 is disposed on the LED-element mounting substrate such that the fluorescent support substrate 31 faces the LED-element mounting substrate, in the present modification, the wavelength-conversion member 30 is disposed on the LED-element mounting substrate such that the surface of the wavelength-conversion member 30 on the side on which the first and second fluorescent layers 33 and 35 and the light blocking layers 34 are formed faces the LED-element mounting substrate.

The other steps are similar to those in the second embodiment, the steps including arranging the wavelength-conversion member 30 such that, when seen in plan view, the centers of the protruding portions 32 of the wavelength-conversion member 30 in the width direction coincide with the centers of the corresponding regions between the LED elements 20 of the LED-element mounting substrate, and the light emitting device according to the modification can be manufactured through the steps.

In the modification of the second embodiment, heat generated by the first and second fluorescent layers 33 and 35 is dissipated to the side on which the substrate 10 is disposed not via the fluorescent support substrate 31, but via the bonding layer 40 and the LED elements 20, and thus, a light emitting device having good heat dissipation performance can be obtained.

Although the embodiments and the modifications of the present invention have been described above, the present invention is not limited to these.

For example, in the embodiments and the modifications, the wavelength-conversion member 30 is disposed such that, when seen in plan view, the protruding portions 32 of the wavelength-conversion member 30 are positioned above the corresponding regions between the LED elements 20 of the LED-element mounting substrate, specifically, such that the centers of the protruding portions 32 of the wavelength-conversion member 30 in the width direction coincide with the centers of the corresponding regions between the LED elements 20 of the LED-element mounting substrate. However, other arrangements can be also employed.

Figure 11:
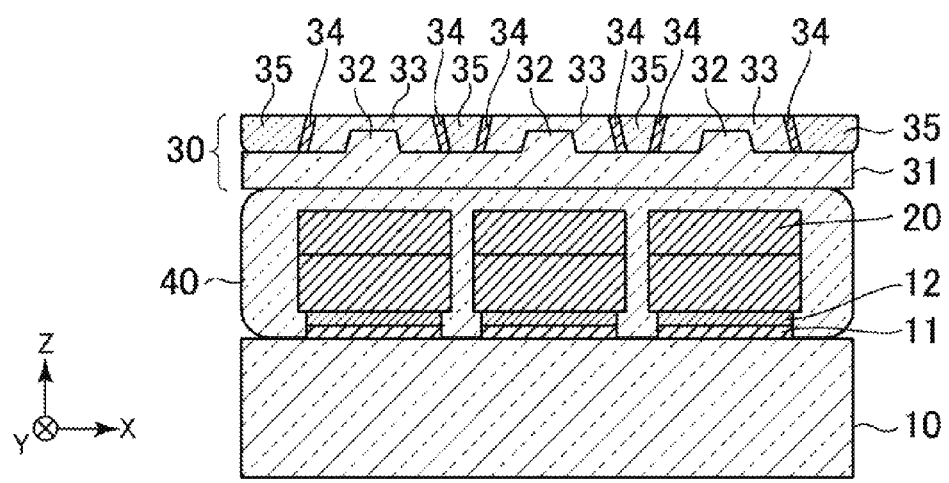
FIG. 11 is a schematic sectional view illustrating another example of the arrangement of a wavelength-conversion member.

FIG. 11 illustrates an example in which the wavelength-conversion member 30 is disposed such that the centers of the protruding portions 32 of the wavelength-conversion member 30 in the width direction coincide with the centers of the corresponding LED elements 20 of the LED-element mounting substrate. Similar to the second embodiment, in the example illustrated in FIG. 11, the wavelength-conversion member 30 in which the first fluorescent layers 33 are left on the top surfaces of the protruding portions 32 is employed. In the wavelength-conversion member 30 of the present example, each of the first fluorescent layers 33 has a thickness larger than that of each of the first fluorescent layers 33 in the second embodiment.

It is obvious to those skilled in the art that other various changes, improvements, combinations, and the like are possible.

The light emitting device according to the present invention can be used as a light source of various illumination devices that are, for example, a vehicle illumination device and a general illumination device. As an example, the light emitting device according to the present invention can be preferably used as a light source for an adaptive driving beam (ADB) of an automobile.

I claim:

1. A light emitting device comprising:
    a plurality of light-emitting elements each having an outline;
    a fluorescent layer that is disposed on or above the plurality of light-emitting elements; and
    light blocking layers that are disposed in the fluorescent layer and that are provided as bodies distinct from the fluorescent layer, two of the light blocking layers being disposed, when an adjacent two of the plurality of light-emitting elements are seen in plan view, at positions each of which is closer than a center of a region between the two light-emitting elements to a center of one of the two light-emitting elements, with the center of the region between the two light-emitting elements functioning as a reference,
    wherein the center of the region between the two light-emitting elements is a center of a region between a side of one of the two light-emitting elements and a side of the other of the two light-emitting elements,
    wherein the two of the light blocking layers are disposed along the outlines of the two light-emitting elements so as to block light that travels through the fluorescent layer in a lateral direction,
    wherein the fluorescent layer is formed on a substrate that includes protruding portions, and the light blocking layers are disposed along the protruding portions, and
    wherein the substrate, which includes the protruding portions, is arranged such that a surface of the substrate on which the protruding portions are not formed faces the light-emitting elements.

2. The light emitting device according to claim 1, wherein, when seen in plan view, the light blocking layers are disposed at positions that are superposed with the light-emitting elements.

3. The light emitting device according to claim 1, wherein each of the light blocking layers is disposed on a side opposite to a side on which the center of a corresponding one of the light-emitting elements is present with a median line between the center of the light-emitting element and the outline of the light-emitting element functioning as references.

4. The light emitting device according to claim 1, wherein, when seen in plan view, the light blocking layers partition the fluorescent layer into first fluorescent regions that are superposed with regions between the light-emitting elements and second fluorescent regions that are superposed with the centers of the light-emitting elements, and the first fluorescent regions are disposed between the two of the light blocking layers disposed along the outlines of the two light-emitting elements.

5. The light emitting device according to claim 4, wherein wavelength conversion efficiency in the first fluorescent regions is lower than wavelength conversion efficiency in the second fluorescent regions.

6. The light emitting device according to claim 1, wherein the protruding portions are continuously or discontinuously arranged along the outlines of corresponding ones of the light-emitting elements.

7. The light emitting device according to claim 1, wherein the protruding portions are arranged above regions between the light-emitting elements.

8. The light emitting device according to claim 7, wherein, when seen in plan view, the protruding portions are arranged such that centers of the protruding portions coincide with centers of the regions between the light-emitting elements, and an arrangement pitch of the protruding portions is equal to an arrangement pitch of the light-emitting elements.

9. The light emitting device according to claim 1, wherein fluorescent regions are formed between side surfaces of the protruding portions and the light blocking layers.

10. The light emitting device according to claim 9, wherein the fluorescent regions are formed in the side surfaces and top surfaces of the protruding portions.

11. A method for manufacturing the light emitting device according to claim 1, the method comprising:
    preparing a support substrate that includes a protruding portion;
    disposing a first fluorescent layer on a top surface and a side surface of the protruding portion and disposing a light blocking layer on the first fluorescent layer;
    forming a second fluorescent layer on the support substrate including a region in which the protruding portion is formed;
    grinding the second fluorescent layer to a thickness at which at least the light blocking layer is removed, to obtain the fluorescent layer which includes the first and second fluorescent layers; and
    disposing the support substrate on or above the plurality of light-emitting elements.

12. The method according to claim 11, wherein the disposing of the first fluorescent layer and the light blocking layer includes:
    preparing a sheet, which includes fluorescent substances, as the first fluorescent layer and forming the light blocking layer on the sheet; and
    disposing the sheet, on which the light blocking layer has been formed, on the protruding portion.

13. The method according to claim 11, wherein, in the disposing of the support substrate, the support substrate is disposed such that the protruding portion is positioned above the region between the light-emitting elements.

14. The method according to claim 13, wherein, in the disposing of the support substrate, the support substrate is disposed such that, when seen in plan view, the center of the protruding portion coincides with the center of the region between the light-emitting elements.

15. The method according to claim 11, wherein, in the grinding of the second fluorescent layer, the second fluorescent layer is ground to a thickness at which the first fluorescent layer on the top surface of the protruding portion is removed.

16. The method according to claim 11, wherein, in the grinding of the second fluorescent layer, the second fluorescent layer is ground to a thickness at which the first fluorescent layer on the top surface of the protruding portion is retained.

17. The method according to claim 11, wherein, in the forming of a second fluorescent layer, the second fluorescent layer is formed by using fluorescent substances that are the same as the fluorescent substances included in the first fluorescent layer.

18. The light emitting device according to claim 1, wherein each of the light blocking layers has a light-reflecting function.

\* \* \* \* \*